(12) United States Patent
Kawazoe

(10) Patent No.: US 6,661,158 B2
(45) Date of Patent: Dec. 9, 2003

(54) PIEZOELECTRIC DEVICE AND METHOD FOR PRODUCING THE SAME

(75) Inventor: Naoyuki Kawazoe, Hashima (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/021,435

(22) Filed: Dec. 19, 2001

(65) Prior Publication Data

US 2002/0084872 A1 Jul. 4, 2002

(30) Foreign Application Priority Data

Dec. 28, 2000 (JP) ........................................ 2000-400204

(51) Int. Cl.[7] .............................................. H01L 41/083
(52) U.S. Cl. ....................................................... 310/328
(58) Field of Search ................................. 310/328, 366

(56) References Cited

U.S. PATENT DOCUMENTS 5,389,851 A * 2/1995 Kimura et al. .............. 310/340
5,438,232 A * 8/1995 Inoue et al. ................. 310/328
6,462,464 B2 * 10/2002 Mitarai et al. .............. 310/366

FOREIGN PATENT DOCUMENTS

| EP | 000587192 A1 | * 11/1994 | ............ B41J/2/295 |
| JP | JUMP55-71571 | 5/1980 | ............ H01L/41/08 |
| JP | 62-88382 | * 4/1987 | ............ H01L/41/08 |

* cited by examiner

Primary Examiner—Thomas M. Dougherty
(74) Attorney, Agent, or Firm—Nixon & Vanderhye P.C.

(57) ABSTRACT

A stacked piezoelectric device 1 comprising a plurality of piezoelectric layers which are stacked one over another has an abutment 61, 62 which is brought into direct abutment with at least one end face 101, 102 of the piezoelectric device 1 in a stretching direction and a coating member 4 having electrically insulating properties and which covers an abutment portion 60 between the abutment member 61, 62 and the piezoelectric device 1 so that the abutment condition of the abutment member and the piezoelectric device can be maintained.

6 Claims, 14 Drawing Sheets

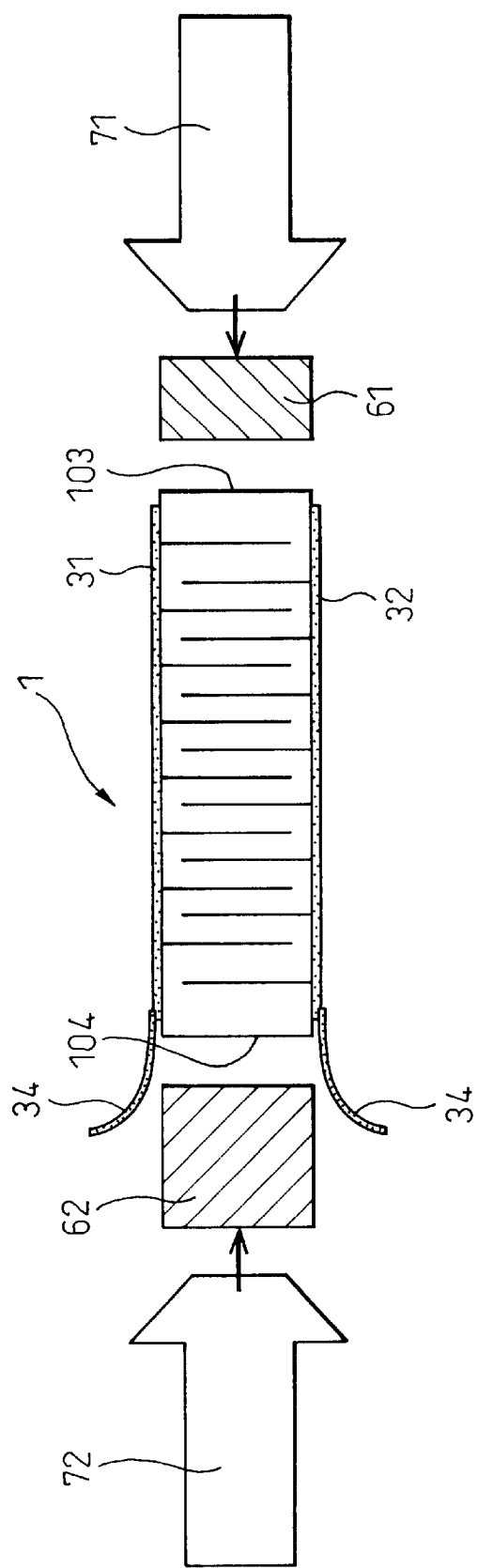

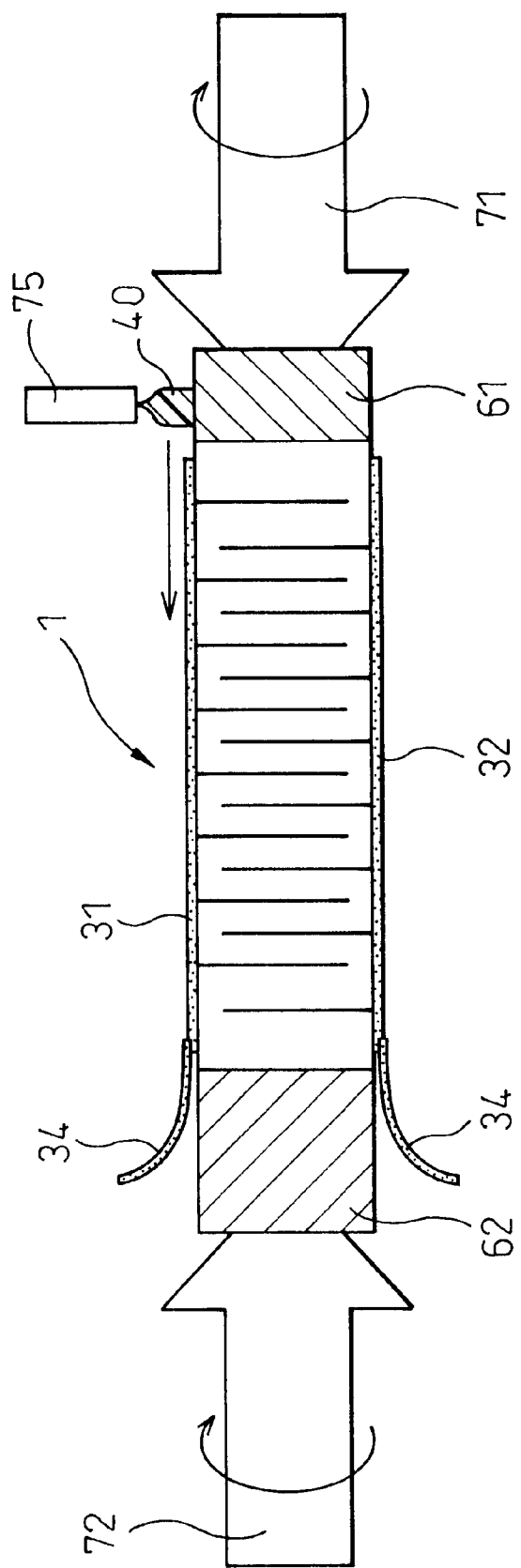

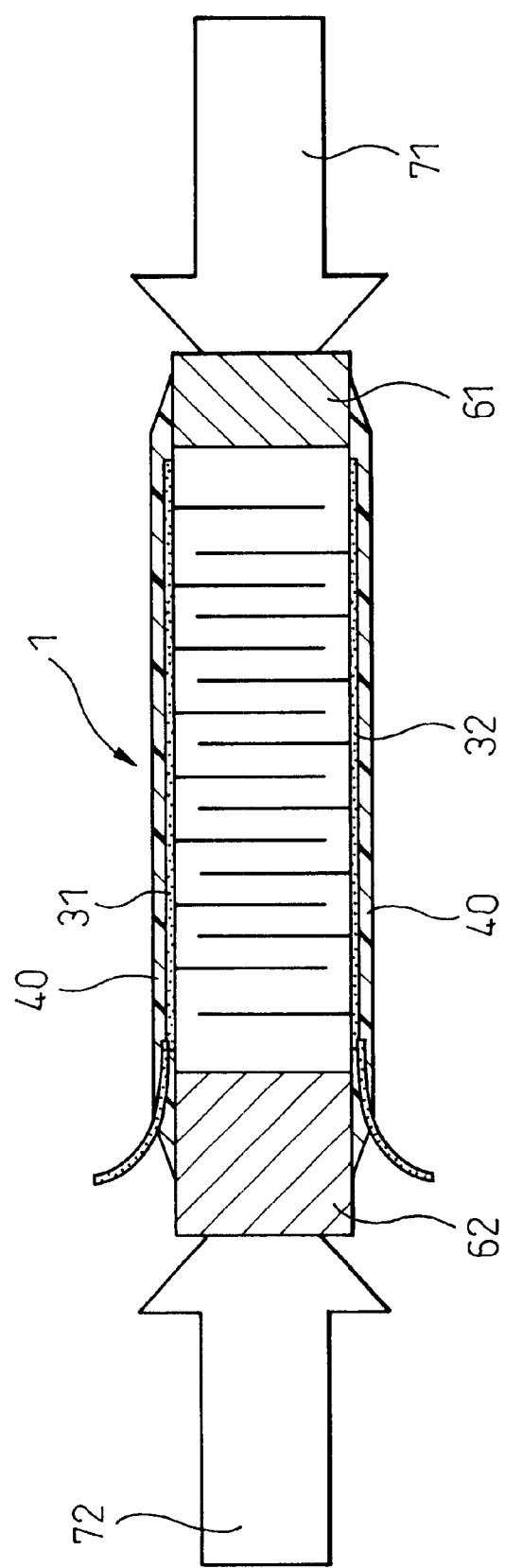

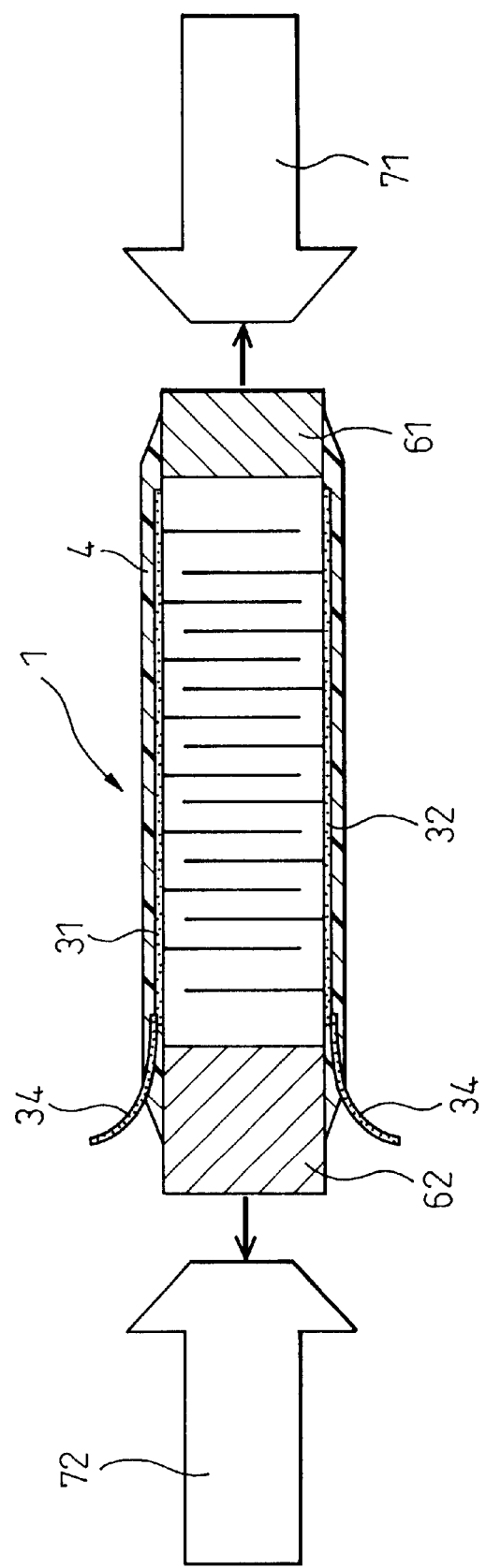

PIEZOELECTRIC DEVICE AND METHOD FOR PRODUCING THE SAME

BACKGROUND OF THE INVENTION

1. Field of the Invention

The present invention relates to a piezoelectric device for use as a drive source for an injector.

2. Description of the Related Art

Injectors (fuel injection devices) for an automobile internal combustion engine are constructed to inject fuel, for example, by putting nozzle needles in open condition by altering the pressure imparted to the nozzle needles through switching the open/close conditions of fuel passages by moving valve elements of three-way or two-way valves connected to a common rail in which high-pressure fuel is accumulated.

Then, in general, electromagnetic valves are used as drive sources for moving the valve elements. On the other hand, there have been attempts to use piezoelectric devices as the drive sources in order to precisely control the fuel injecting conditions by controlling in turn the drive sources finely.

However, there has not yet been put into practice any injector employing a piezoelectric device.

This is because the piezoelectric devices for injectors need to be compact in size and be able to be mass produced easily and consistently while ensuring quality.

Japanese Unexamined Utility Model Publication (U.M. Kokai) No. 55-71571 discloses a conventional piezoelectric device. As shown in FIG. 18, in this conventional piezoelectric device, an insulating protection layer 95 made from elastic epoxy resin is disposed around the outer circumference of a piezoelectric device 9, and thereafter metallic blocks 96, which are larger in diameter than the piezoelectric device, are disposed at both ends of the piezoelectric device in the stretching direction thereof.

With this conventional piezoelectric device 9, the provision of the metallic blocks 96 produces waste space in an installation space in the injector where the piezoelectric device is installed, and therefore the conventional piezoelectric device cannot meet the demand for miniaturization of the injector.

In addition, since the metallic blocks 96 need to be disposed on the piezoelectric device after the insulating protection layer 95 has been provided thereon, assembling the piezoelectric device to the injector becomes complex. Additionally, as shown in FIG. 19, there is a drawback in that unnecessary protruding portions 959 are formed on an end of the piezoelectric device when the insulating protection layer 95 is formed.

Furthermore, an adhesive has to be used to fix abutment members such as the metallic blocks integrally on upper and lower surfaces of the piezoelectric device. In this case, however, the stretching movement of the piezoelectric device is transmitted via the adhesive, and therefore, this may lead to a risk that generated force is lost.

SUMMARY OF THE INVENTION

The invention was developed in light of the above conventional drawbacks, and an object thereof is to provide a piezoelectric device which is compact in size and easy to produce and which exhibits superior generated force.

According to the invention, there is provided a stacked piezoelectric device comprising a plurality of piezoelectric layers and electrode layers which are stacked in alternate fashion, the stacked piezoelectric device being characterized by provision of an abutment member which is brought into direct abutment with at least one end face of the piezoelectric device in a stretching direction thereof and a coating member having electric insulating properties which covers at least part of the abutment portion between the abutment member and the piezoelectric device so that the state is maintained in which the abutment member and the piezoelectric device are in abutment with each other.

According to the invention, as described above, the abutment member is brought into abutment with the end face of the piezoelectric device in the stretching direction thereof, and the abutment state is maintained with the coating member.

Since no adhesive is interposed between the abutment member and the piezoelectric device, this allows the stretching movement of the piezoelectric device to be directly transmitted to the abutment member, whereby superior generated force can be maintained.

In addition, since the joined condition of the abutment member to the piezoelectric member is maintained by the coating member, the abutment member and the piezoelectric device can be handled as one piece with ease, thereby facilitating case of production.

Moreover, the provision of the abutment member ensures that the coating member is prevented from protruding from the end face of the piezoelectric device in the stretching direction thereof when the coating member is disposed, further facilitating production of the piezoelectric device.

Thus, according to the invention, there is provided a piezoelectric device which is compact in size and easy to produce and which exhibits superior generated force.

Next, according to the invention, there is provided a method for producing a stacked piezoelectric device comprising a plurality of piezoelectric layers and electrode layers which are stacked in alternate fashion, the method comprising the steps of bringing an abutment member into direct abutment with at least one end face of the piezoelectric device in a stretching direction thereof and clamping the piezoelectric device with a pair of fixtures from both ends of the piezoelectric device in the stretching direction thereof, next supplying a coating material having fluidity to at least an outer circumference of the abutment portion of the abutment member to the piezoelectric device, and allowing the coating material to set to thereby form a coating member for maintaining the abutment condition of the abutment member to the piezoelectric device.

According to the method of the invention, unitization of the abutment member and the piezoelectric device is ensured with the coating member without using an adhesive, thereby making it possible to obtain a superior piezoelectric device.

Various methods can be used as the method for supplying the coating material, and include dripping by a dispenser, coating by a roller coater, spraying, dipping and the like.

The invention may be more fully understood from the description of preferred embodiments thereof, as set forth below, together with the accompanying drawings.

BRIEF DESCRIPTION OF THE DRAWINGS

In the drawings:

FIG. 4 is an explanatory view showing a process for bringing abutment members into abutment with the piezoelectric device according to the first embodiment of the invention, FIG. 5 is an explanatory view showing a process for supplying a coating material with the abutment members being in abutment with the piezoelectric device according to the first embodiment of the invention, FIG. 6 is an explanatory view showing a process for curing the coating material supplied to the piezoelectric device to set according to the first embodiment of the invention, FIG. 7 is an explanatory view showing a process for removing fixtures from the piezoelectric device according to the first embodiment of the invention, FIGS. 17A, 17B show, respectively, cross-sectional configurations of a piezoelectric device according to a sixth embodiment of the invention, in which FIG. 17A shows a piezoelectric device having a polygonal cross section, and FIG. 17B shows a piezoelectric device having a barrel-like cross section.

DESCRIPTION OF THE PREFERRED EMBODIMENTS

First Embodiment

A piezoelectric device according to a first embodiment of the invention will be described with reference to FIGS. 1A to 7.

Figure 1A:
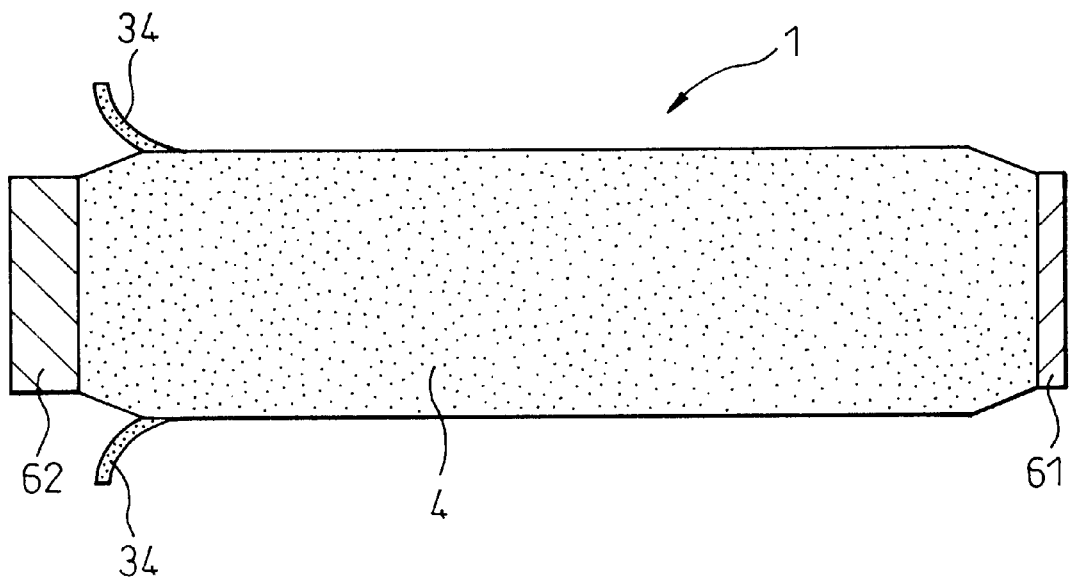
FIG. 1A is a side view of a piezoelectric device according to a first embodiment of the invention.
Figure 1B:
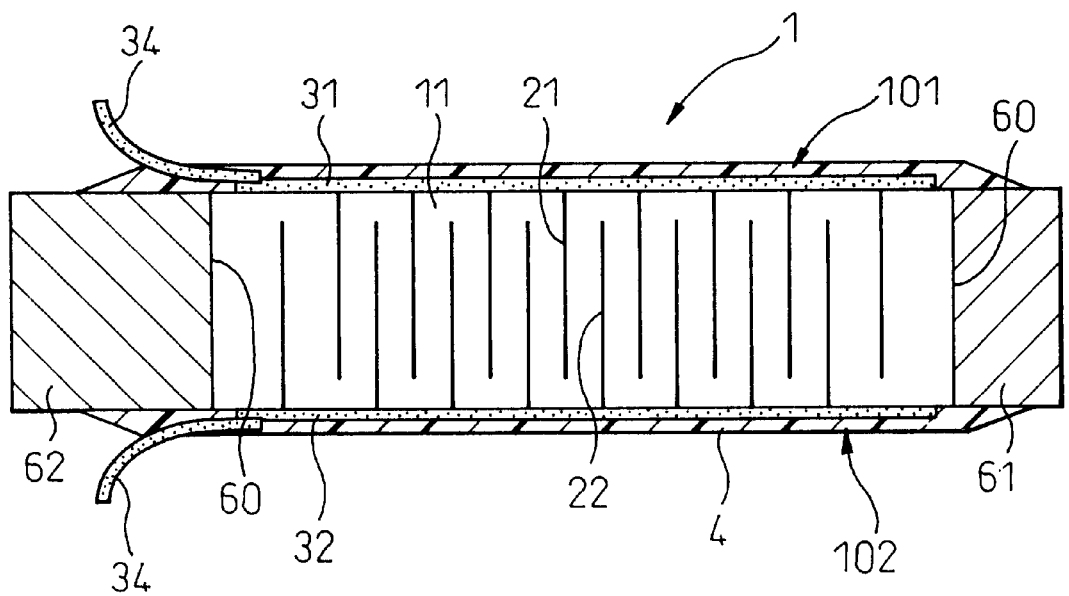
FIG. 1B is a sectional view thereof.

As shown in FIGS. 1A, 1B, a piezoelectric device according to a first embodiment of the invention is a stacked-type piezoelectric device comprising a plurality of piezoelectric layers 11 which are stacked one over another. The piezoelectric device has an abutment member 61, 62 brought into direct abutment with at least one end face of the piezoelectric device 1 in a stretching direction thereof and a coating material 4 having electric insulating properties which covers at least part of the abutment portion between the abutment member 61, 62 and the piezoelectric device 1 so that the abutment condition of the abutment member to the piezoelectric device is maintained. Note that FIG. 1A is a side view of the piezoelectric device 1 and FIG. 1B is a sectional view thereof.

The piezoelectric device constructed as described above will be described in detail below.

As shown in FIGS. 2 and 3A to 3C, in the piezoelectric device 1, internal electrode layers 21, 22 are formed between the piezoelectric layers 11 in such a manner as to constitute positive and negative electrodes in alternate fashion. As shown in the same figures, the internal electrode layers 21 are disposed in such a manner as to be exposed to one side 101 of the layer 11, whereas the other internal electrode layers 22 are disposed in such a manner as to be exposed to an opposite side 102 of the layer 11. Then, side electrodes 31, 32 made of curing silver are formed on the sides 101, 102 of the piezoelectric device 1, respectively, to electrically connect the exposed ends of the internal electrode layers 21, 22.

The curing silver constituting the side electrodes 31, 32 is an electrode made by curing an Ag paste, as will be described later, which is composed of Ag (97%) and glass frit constituents (3%).

As shown in FIGS. 1A, 1B, external electrodes 34 are joined to the side electrodes 31, 32 with conductive adhesive. Lead wires are used as the external electrodes 34.

The conductive adhesive is composed of 80% of Ag and 20% of epoxy resin.

Figure 2:
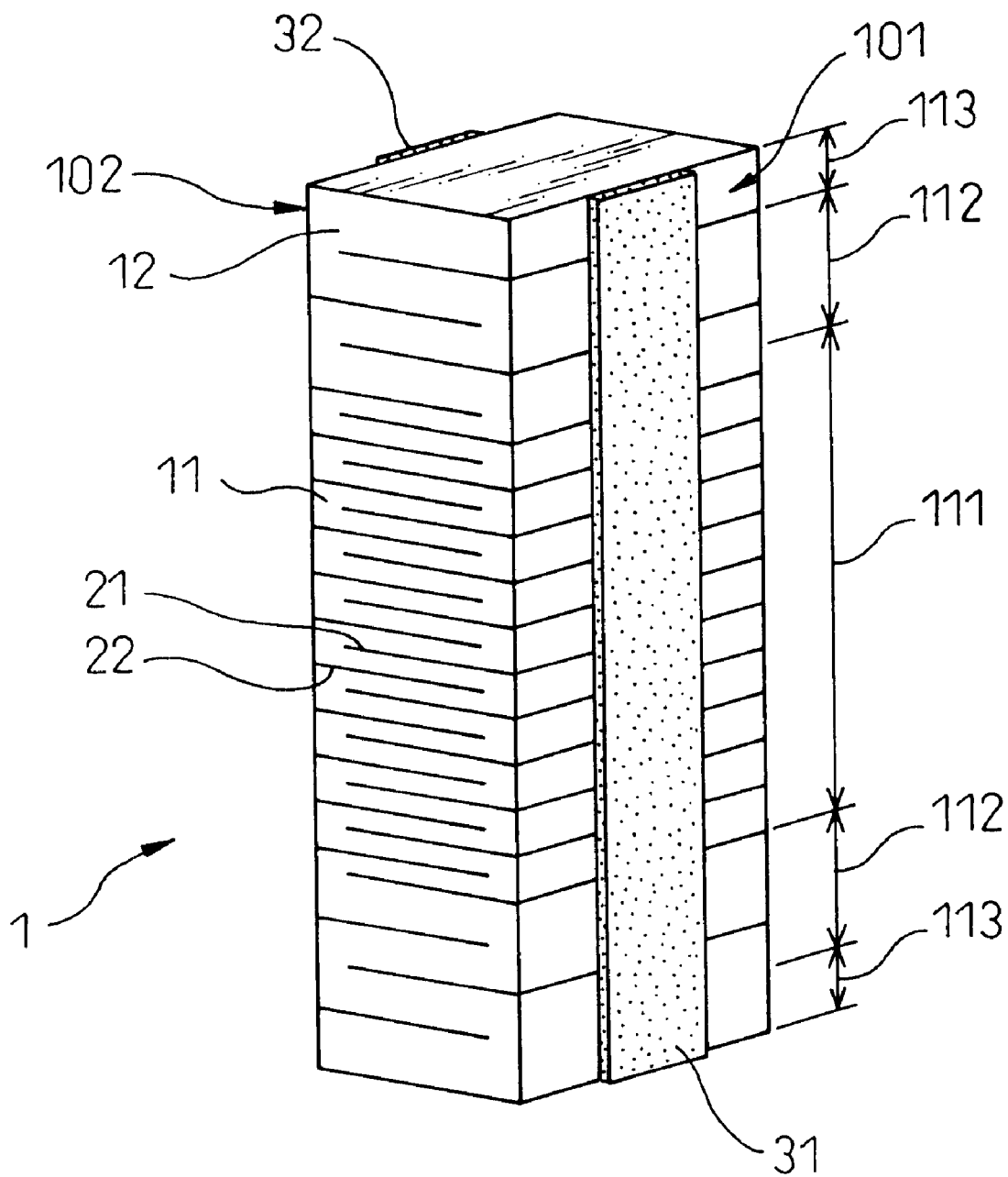
FIG. 2 is a perspective view of the piezoelectric device according to the first embodiment of the invention.

In addition, as shown in FIG. 2, in the piezoelectric device 1, a central portion in the stacking direction is made to function as a drive portion 111, portions disposed to hold the central portion therebetween are made to function as buffer portions 112, and portions disposed to hold the buffer portions 112 are made to function as dummy portions 113.

A method for producing the piezoelectric device 1 and the detailed construction thereof will be described below.

The piezoelectric device 1 according to the first embodiment of the invention can be produced using a green sheet method which is generally used. To produce a green sheet, powders of lead oxide, zirconium oxide, titanium oxide, niobium oxide, sodium strontium and the like, which constitute major raw materials of the piezoelectric material, are weighed in a known method to obtain a desired composition. In addition, in consideration of the evaporation of lead, the materials are composed so as to become richer by 1 to 2% than the stoichiometric ratio of the composition with the mixing ratio. The materials so composed are then dry mixed in a mixing machine and thereafter are temporarily fired at a temperature ranging from 800 to 950° C.

Next, pure water and a dispersant are added to the temporarily fired powders to make them into slurry, which is then wet-ground in a pearl mill. What is so ground is then dried and powder degreased, and thereafter solvent, binder, plasticizer and dispersant are added thereto for mixing in a ball mill. Then, deaeration and viscosity adjustment of the slurry so made is carried out while it is being stirred in a stirring machine in a vacuum apparatus.

Next, the slurry is formed into a green sheet of a certain thickness using a doctor blade device.

The recovered green sheet is stamped by a press machine or cut by a cutting machine to form a rectangular body of a predetermined size. The green sheet so prepared is used commonly for the drive portion, the buffer portions and the dummy portions.

Figure 3A:
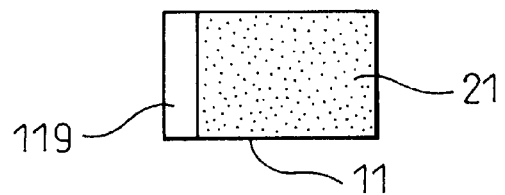
FIGS. 3A and 3B are plan views of a piezoelectric layer and an internal electrode layer, respectively, of the piezoelectric device according to the first embodiment of the invention.
Figure 3B:
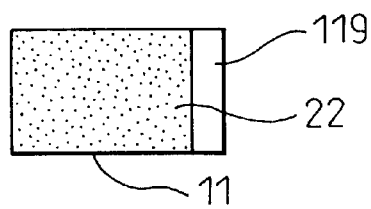

Next, a pattern is formed through screen printing on the surface of one side of the green sheet which is formed, as described above, using a paste composed of silver and palladium with a mixing ratio of silver/palladium=7/3 (hereinafter, referred to as Ag/Pd paste). FIGS. 3A, 3B show examples of green sheets after patterns are printed thereon. Like reference numerals denote substantially like portions, as a matter of convenience.

A pattern 21 (22) which is slightly smaller than the total area of the surface of the green sheet 11 constituting the piezoelectric layer is formed on the surface of the green sheet 11 with the Ag/Pd paste so as to function as the internal electrode layer 21 (22). A portion 119 where the internal electrode layer 21 (22) is not formed is provided on one of opposed sides of the surface of the green sheet 11. More specifically, the internal electrode layer 21 (22) is disposed such that the internal electrode 21 (22) does not reach an end portion (a portion corresponding to the side 101 or 102 of the piezoelectric device 1) of the one of the opposed sides of the green sheet 11, but reaches an end portion of the other of the opposite sides thereof.

Note that in addition to the Ag/Pd paste according to the embodiment, copper, nickel, platinum, silver or a combination of these metals may be used as the material for the internal electrode.

A predetermined number of green sheets 11, on which the internal electrode layer 21 (22) is so formed, are prepared based on a required specification for the displacement amount of the drive portion 111 and the buffer portion 112. In addition, a required number of green sheets 12, on which the internal electrode layer is not printed, are prepared for the buffer portion 112 and the dummy portion 113.

Figure 3C:
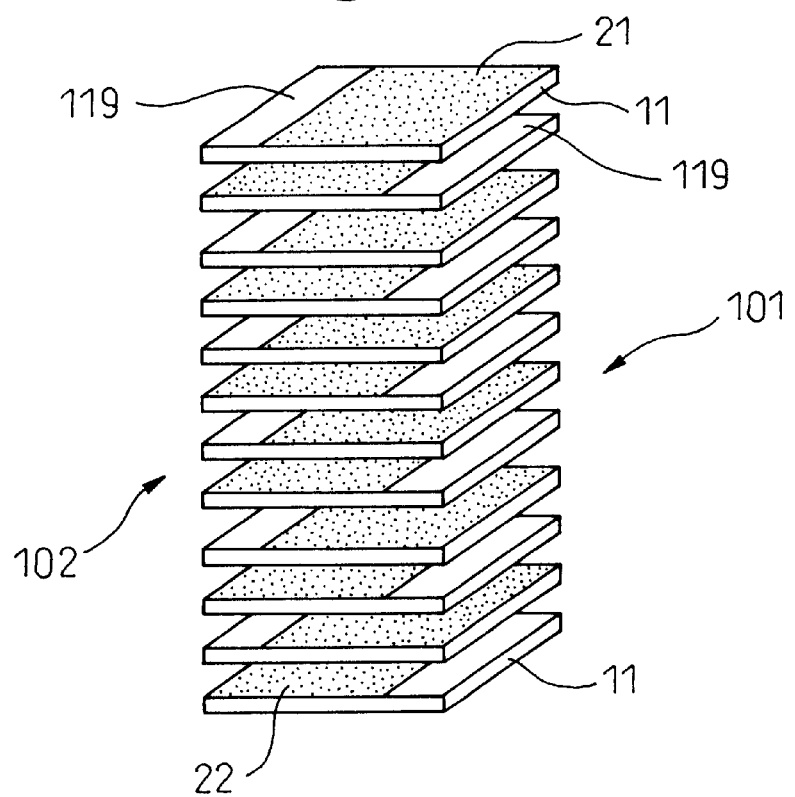
FIG. 3C is an exploded perspective view showing stacked conditions of the piezoelectric layers and the internal electrode layers.

Next, these green sheets 11, 12 are stacked. FIG. 3C shows a state in which the green sheets 11, 12 are stacked, and the figure is substantially an exploded view of the piezoelectric device 1. Note that the figure mainly shows a portion of the piezoelectric device 1 which corresponds to the drive portion thereof.

In stacking the green sheets 11 on which the internal electrode layer 21 (22) is formed, the green sheets 11 are stacked in such a manner that the portion 119, where the electrode is not formed, is positioned alternately on the left and right as viewed in the figure. According to this construction, the exposed internal electrode layers 21, which reach the side 101 of the green sheet 11, which is shown on the right in the figure, constitute one pole of the internal electrode, whereas the exposed internal electrode layers 22, which reach the other side 102 of the green sheet 11, which is shown on the left in the figure, constitutes the other pole of the internal electrode.

Then, in the central drive portion 111, as shown in FIG. 3C, only the green sheets, on which the internal electrode layer 21 (22) is formed, are used and stacked one over another, in the buffer portion 112, the green sheets 12, on which the internal electrode layer is not formed, are stacked in such a manner as to be interposed between the green sheets 11, respectively, and in the dummy portion 113, only the green sheets, on which the internal electrode layer 21 (22) is not formed, are used and stacked one over another.

According to this construction, a stacked body shown in FIG. 2 is provided.

Next, after heat-attaching together the stacked green sheets under pressure using a hot water rubber press, the green sheets are degreased at a temperature ranging from 400 to 700° C. in an electric oven and are then calcined at a temperature ranging from 900 to 1200° C.

Next, the side electrodes 31, 32 are formed on the sides of the stacked body by applying and curing the Ag paste thereto. While the side electrodes in this embodiment are constituted by curing silver, the side electrodes may, for example, be formed by curing the Ag/Pd paste. Copper, nickel, platinum and silver/palladium may be used in addition to the Ag paste according to this embodiment.

The side electrode 31 on the upper side of the piezoelectric device 1 in FIG. 1B is formed at the position where the internal electrode layers 21 are exposed so as to electrically connect the respective internal electrode layers 21. The other side electrode 32 on the lower side of the piezoelectric device 1 in the same figure is formed at the position where the internal electrode layers 22 are exposed so as to electrically connect the respective internal electrode layers 22.

Next, coatings on lead wires which act as the external electrodes 34 (FIGS. 1B, 4) are stripped off to be joined to the side electrodes 31, 32 with a conductive adhesive. The conductive adhesive is baked after being applied thereto.

Thereafter, the stacked body, to which the lead wires are attached, is dipped in fluorinated inactivation liquid (Fluorinert, trademark of 3M) so as to apply a direct current voltage between the internal electrode layers 21, 22 via the lead wires (external electrodes 34) to thereby polarize the piezoelectric layers 11, whereby the piezoelectric device 1 is obtained.

Note that soldering and brazing may be used as the method for joining the external electrodes to the internal electrodes, in addition to the method used in this embodiment. Further, the external electrodes can be connected to the internal electrodes with an electrically conductive adhesive without using the side electrodes. Moreover, a flat or wavy metallic wire may be used for the material for the external electrode in addition to the lead wire used in this embodiment.

Note that the green sheet (piezoelectric layer) 12 made of the same material as that used for the piezoelectric layer 11 used for the drive portion 111, is used for the dummy portion 113 as described above, thereby reducing the number of types of materials used, in order to reduce production costs.

Next, as shown in FIGS. 4 to 7, abutment members 61, 62 are brought into direct abutment with both end faces of the piezoelectric device 1 in the stretching direction thereof and the abutment portions 60 are covered with a coating member 4.

In this embodiment, the abutment members 61, 62 are made from alumina having electrically insulating properties. The respective abutment members 61, 62 each have an abutment surface having a substantially similar configuration to that of the piezoelectric device.

Note that silicon nitride, for example, may be used instead of alumina. It is preferable to use a material for the abutment members 61, 62 whose Young's modulus of elasticity is larger in order to efficiently transmit the generating force of the piezoelectric device.

In addition, a metal such as stainless steel can be used as the abutment member, as long as a required insulating distance is ensured between the electrodes of the piezoelectric device and the abutment members.

Firstly, as shown in FIG. 4, the abutment members 61, 62 are brought into direct abutment with end faces 103, 104 of the piezoelectric device 1 in the stretching direction thereof, and the piezoelectric device, with which the abutment members are so abutted, is then held with a pair of fixtures 71, 72 from both sides in the stretching direction thereof.

Next, as shown in FIG. 5, a coating material 40 having fluidity is supplied to an outer circumference of the abutment portion between the piezoelectric device 1 and the abutment member 61. In this embodiment, polyimide resin is used as the coating material 40. Note that epoxy resin, silicone resin, polyurethane resin and fluororubber may be used as the polyimide resin.

In this embodiment, as shown in FIG. 5, supply of the coating material 40 is carried out by using a dispenser 75. Note that methods of coating with a roll coater, spraying and dipping may be adopted instead of the method using the dispenser 75.

Then, the pair of fixtures 71, 72 are rotated on the axis of the piezoelectric device 1 extending in the stretching direction thereof relative to the supply point of the coating material 40 and are also translated relative to the supply point in the axial direction of the piezoelectric device. In this embodiment, the aforesaid movements are realized by rotating the fixture 71 and translating the dispenser 75.

Next, as shown in FIG. 6, the piezoelectric device 1 is placed in an oven while being held with the fixtures 71, 72 therebetween, and heated in three steps at a retention temperature of 90° C. for 15 minutes, 150° C. for 15 minutes and 200° C. for 60 minutes to allow the coating material 40 to cure (set), whereby, as shown in FIG. 7, the coating member 4 is formed for maintaining the abutment conditions of the piezoelectric member 1 and the abutment members 61, 62 without using an adhesive. Note that the aforesaid three-step curing process is used only to prevent the generation of voids, and that the thickness of the coating member 4 obtained was 100 μm.

Next, the operation and effectiveness of the first embodiment will be described below.

In this embodiment, as has been described heretofore, the abutment members 61, 62 are brought into abutment with the end faces of the piezoelectric device 1 in the stretching direction thereof, and the abutment conditions are maintained with the coating member 4, and no adhesive interposed between the abutment members 61, 62 and the piezoelectric device 1.

Due to this, the stretching movements of the piezoelectric device 1 can be transmitted to the abutment members 61, 62 directly, whereby the superior generated force can be maintained.

In addition, since the joined conditions of the abutment members 61, 62 to the piezoelectric device 1 are maintained with the coating member 4, the abutment members and the piezoelectric device can be handled as one piece with ease, thereby facilitating production.

Additionally, in disposing the coating member 4, the presence of the abutment members 61, 62 ensures that protrusion of the coating member 4 from the end faces 103, 104 of the piezoelectric device 1 in the stretching direction thereof is prevented, further facilitating production.

In this embodiment, the abutment surfaces of the abutment members 61, 62 and the piezoelectric device 1 are substantially of the same configuration. Due to this, the coating member 4 can be smoothly disposed at the abutment portions where the abutment members 61, 62 are in abutment with the piezoelectric device 1, whereby the unitization of the members can be realized in a more stable fashion.

In addition, the force generated at the time of stretching of the piezoelectric device 1 can be transmitted to the abutment members 61, 62 without loss.

Furthermore, in this embodiment, since alumina having electrically insulating properties is used for the abutment members 61, 62, short circuiting or migration via the abutment members can be prevented. In addition, the transmission efficiency of the generated force by the piezoelectric device 1 can be improved as a result of the high Young's modulus of elasticity provided by alumina.

Additionally, in this embodiment, since the coating member 4 covers the full circumference of the abutment portions between the piezoelectric device 1 and the respective abutment members 61, 62, the abutment conditions between the piezoelectric device 1 and the abutment members 61, 62 can be maintained more strongly. On top of this, since not only the abutment portions but also the entire outer circumference of the piezoelectric device 1 are covered with the coating member 4, secure insulating conditions can be obtained with ease.

Figure 8:
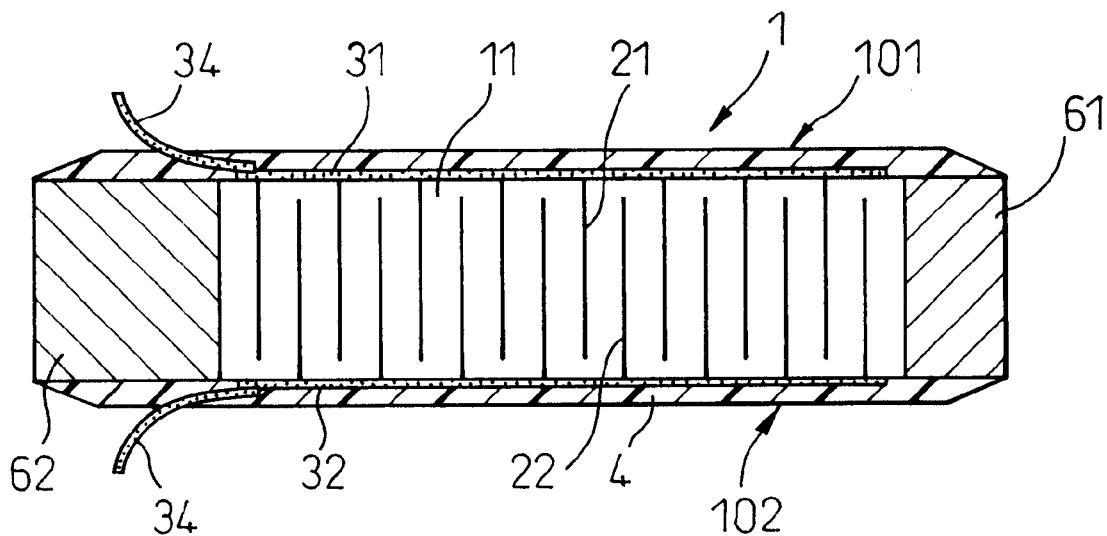
FIG. 8 is a sectional view of a modified example of the piezoelectric device according to the first embodiment of the invention.
Figure 9:
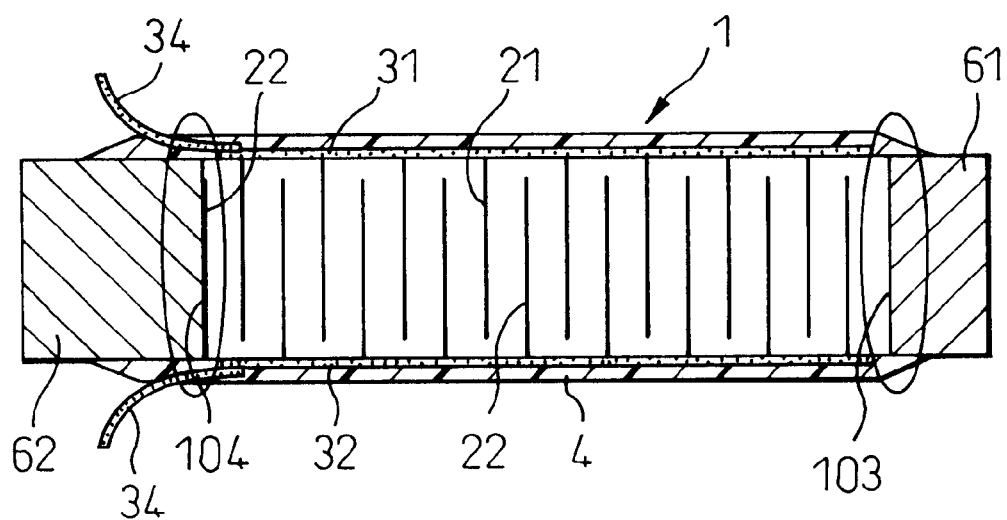
FIG. 9 is a sectional view of another modified example of the piezoelectric device according to the first embodiment of the invention.

FIG. 8 is a sectional view of a modified example of the piezoelectric device 1 according to the first embodiment of the invention. As is seen from this modified example, the coating member 4 may be disposed as far as end faces of the abutment members 61, 62. FIG. 9 is a sectional view of another modified example of the piezoelectric device 1 according to the first embodiment of the invention. As is seen from this modified example, an electrode similar to the internal electrode layer 21, 22 may be formed on at least one of the end faces 103, 104 of the piezoelectric device 1.

Second Embodiment

Figure 10:
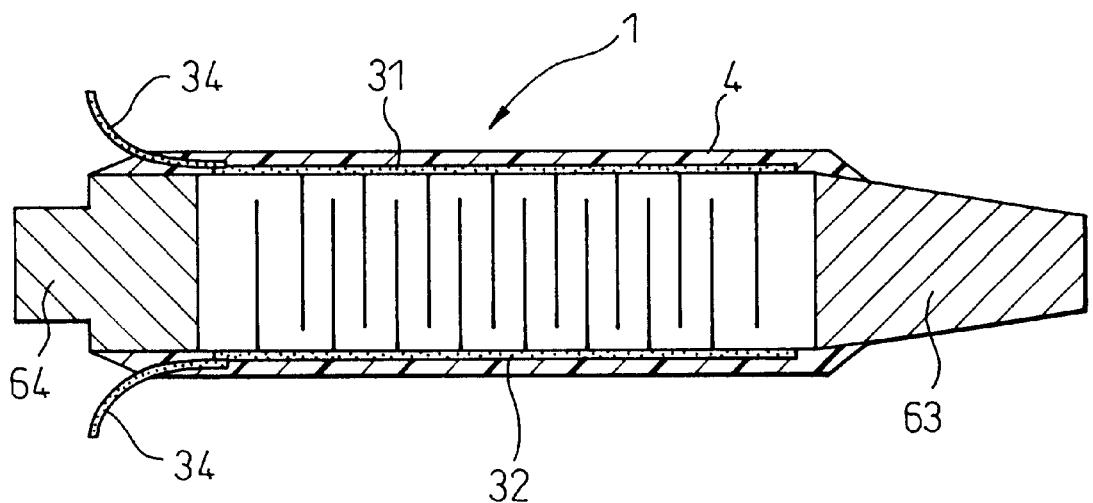
FIG. 10 is a sectional view of a piezoelectric device according to a second embodiment of the invention.

As shown in FIG. 10, according to this embodiment, there are provided abutment members 63, 64 whose cross sections vary along the longitudinal direction thereof. The other features thereof are similar to those of the first embodiment.

In this case, the abutment members 63, 64 can be used as, for example, pistons. Other than this, similar operation and effectiveness to those of the first embodiment can be obtained.

Third Embodiment

Figure 11:
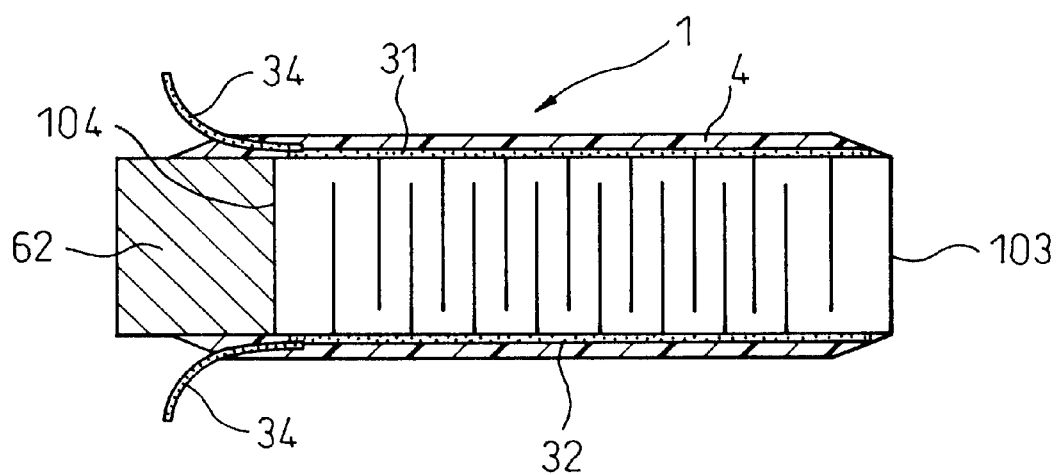
FIG. 11 is a sectional view of a piezoelectric device according to a third embodiment of the invention.

As shown in FIG. 11, according to this embodiment, the abutment member 62 is disposed only on the one end face 104 of the piezoelectric device 1. The other features remain the same as those described with respect to the first embodiment.

In this case, while the effect obtained when the abutment members are provided on the end faces of the piezoelectric device 1, cannot be obtained as it is, there is obtained an advantage in that the length of the piezoelectric device 1 can be reduced.

Fourth Embodiment

As shown in FIGS. 12 to 15, according to this embodiment, there are provided some examples in which the coating member 4 is not disposed on the abutment portions between the abutment members 61, 62 and the piezoelectric device 1, nor around the full circumference of the piezoelectric device 1, but is disposed partially thereon.

Figure 12:
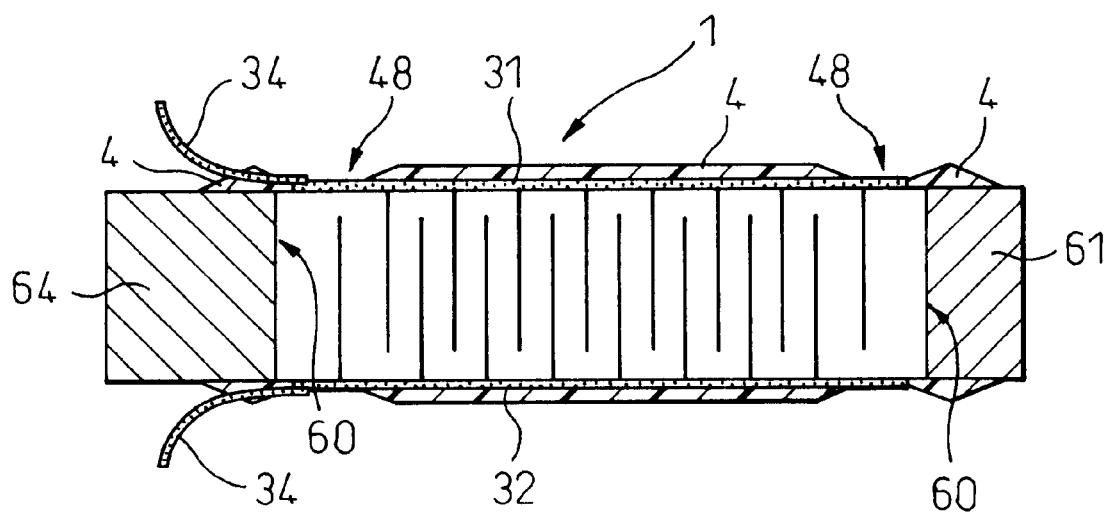
FIG. 12 is a sectional view of a piezoelectric device according to a fourth embodiment of the invention.

FIG. 12 is a sectional view, and in an example shown therein, the coating member 4 is disposed around the full circumference of the abutment portion between the abutment members 61, 62 and the piezoelectric device 1, and around the full circumference of the portion of the piezoelectric device 1 where the internal electrode layers 21, 22 are present, and portions 48 are provided therebetween where the coating member is not present.

Figure 13:
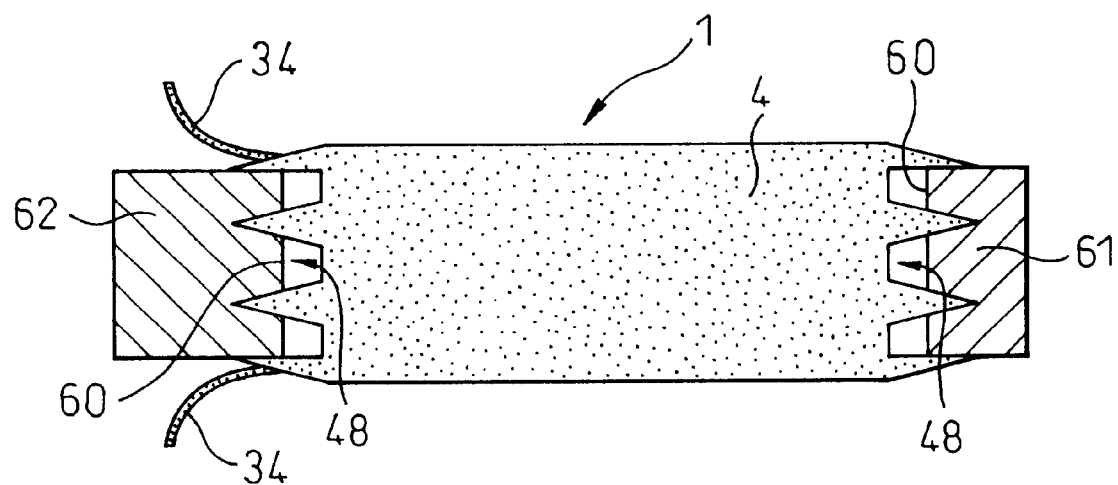
FIG. 13 is a side view of a modified example of the piezoelectric device according to the fourth embodiment of the invention.

FIG. 13 is a side view, and in an example shown in this figure, the abutment portion 60 is partially covered with the coating member 4, and portions 48 where no coating member is present are provided in places on the abutment portion 60.

Figure 14:
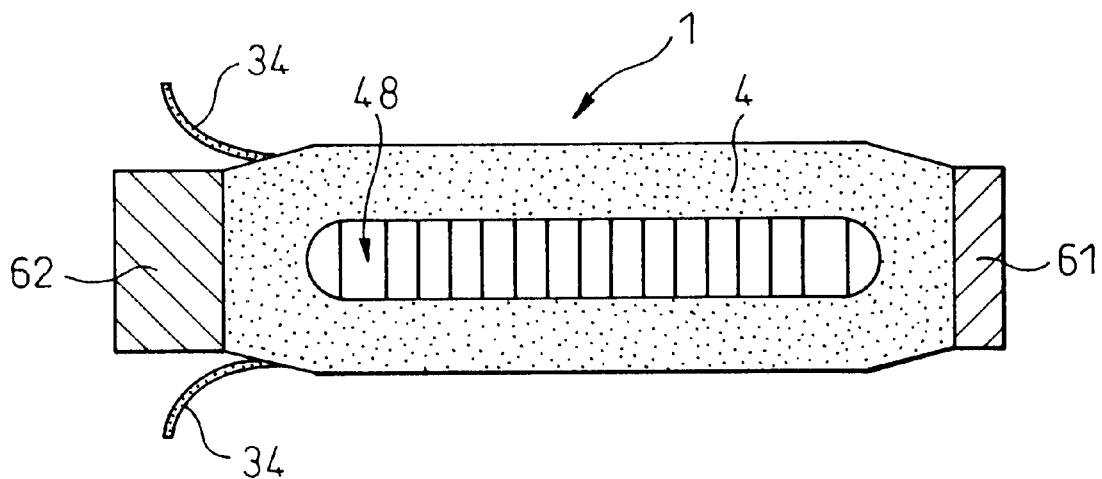
FIG. 14 is a side view of another modified example of the piezoelectric device according to the fourth embodiment of the invention.

FIG. 14 is also a side view, and in an example shown in this figure, the circumference of the piezoelectric device 1 is partially covered with the coating member 4, and portions 48 where no coating member is present are provided in places on the outer circumference of the piezoelectric device.

Figure 15:
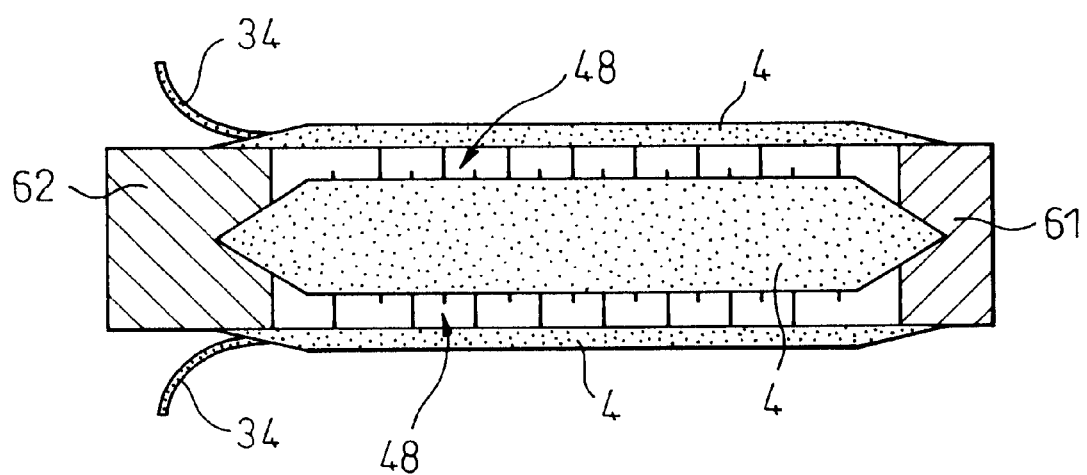
FIG. 15 is a further modified example of the piezoelectric device according to the fourth embodiment of the invention.

FIG. 15 is also a side view, and in this embodiment shown in this figure, the circumference of the piezoelectric device 1 and the abutment portions are both covered with the coating member 4 partially, and portions 48 where no coating member is present are provided thereon in places.

In these cases, too, the operation and effectiveness similar to those of the first embodiment can be obtained.

Fifth Embodiment

According to this embodiment, the piezoelectric device 1 according to the first embodiment is used for driving an injector.

Figure 16:
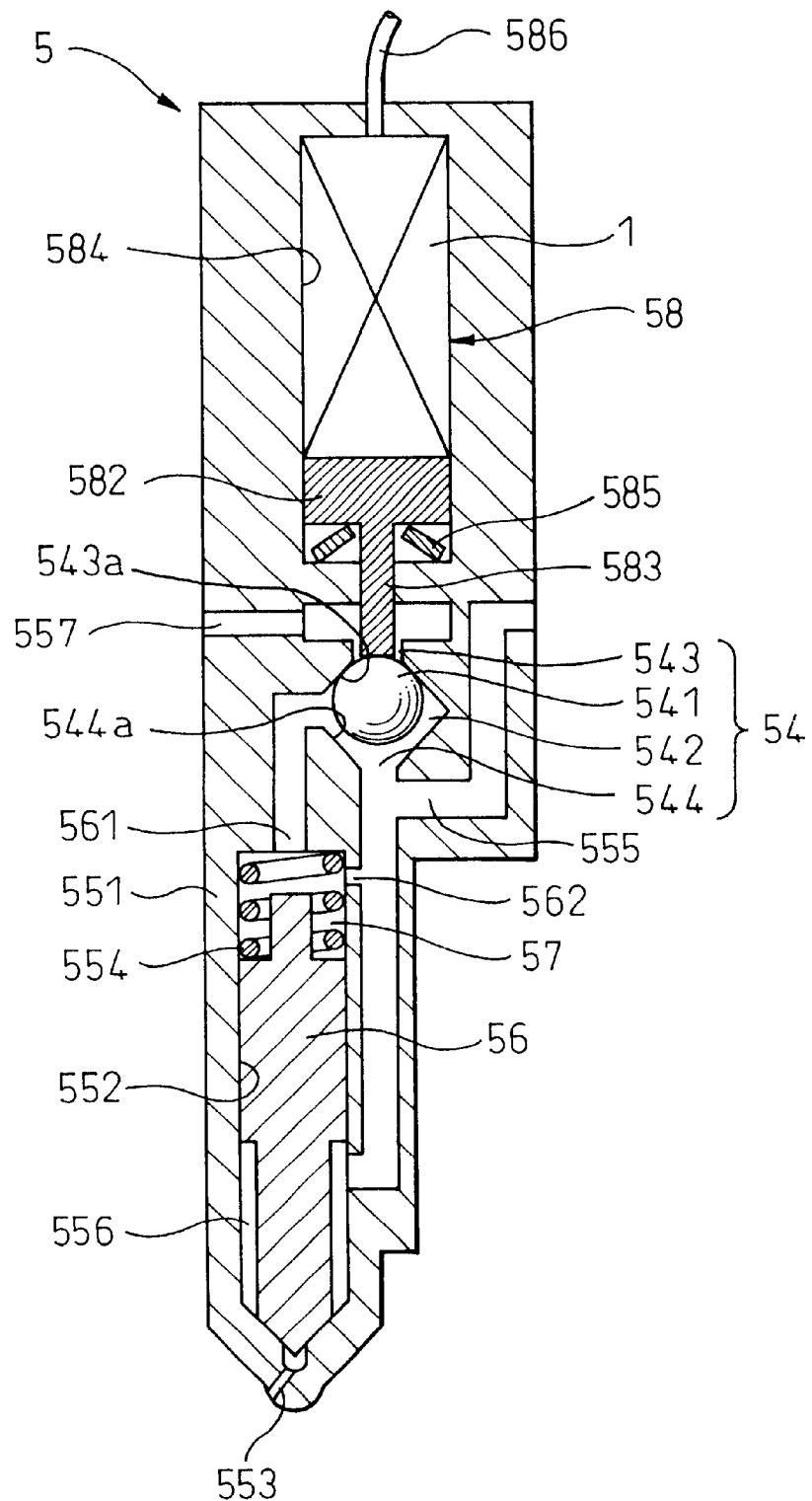
FIG. 16 is an explanatory view showing the construction of an injector according to a fifth embodiment of the invention.

As shown in FIG. 16, an injector 5 is used in a common rail fuel injection system to inject high-pressure fuel accumulated in a common rail into each cylinder of an engine. In the same figure, a cylinder 552 is provided in a lower end portion of a valve housing 551 so that a nozzle needle 56 is slidably installed therein. A distal end portion of the nozzle needle is brought into abutment with an injection hole 553 in a distal end portion of the valve housing 551 to thereby close the hole.

A control chamber 57 is formed in an upper end portion in the cylinder 552 for imparting pressure to the nozzle needle 56 in a valve closing direction, and as the oil pressure within the control chamber 57 fluctuates, the nozzle needle 56 moves within the cylinder 552. In addition, a spring 554 is disposed within the control chamber 57 for biasing the nozzle needle in the valve closing direction. The diameter of a lower half portion of the nozzle needle 56 is slightly decreased so as to form an annular space between the lower half portion thereof and the cylinder 552, so that the annular space constitutes a fuel reservoir 556 communicating with a high-pressure passage 555.

A three-way valve 54 for fluctuating the pressure in the control chamber 57 is provided in a middle portion of the valve housing 551. The three-way valve 54 has a valve chamber 542 having in turn a drain port 543 as a low-pressure port in an upper end portion thereof and a high-pressure port 544 in a lower end portion thereof, as well as a ball-like valve element 541 disposed in the valve chamber 542 so as to open and/or close the drain port 543 or the high-pressure port 544. The drain port 543 communicates with a low-pressure portion of a system, not shown, via a drain passage 557 which is a low-pressure passage, whereas the high-pressure port 544 communicates with an external high-pressure fuel source (a common rail) via a high-pressure passage 555.

The valve element 541 is driven by a piezoelectric actuator 58 installed within the upper end portion in the valve housing 551. The piezoelectric actuator 58 comprises the aforesaid piezoelectric device 1 adapted to stretch or contract when a certain voltage is applied thereto and a piezoelectric piston 582 adapted to slide within a cylinder 584 when the abutment member 61 attached to the piezoelectric device 1 is brought into abutment therewith, and a rod 583 extending from a central portion on a lower end face of the piezoelectric piston 582 passes through the high-pressure port 544 to abut against the valve element 541. Then, when the piezoelectric piston 582 fluctuates as the piezoelectric device 1 stretches and contracts, the rod 583 made integral with the piston also fluctuates. As the rod 583 fluctuates, the valve element 541 is brought into abutment with a tapered seat surface 543a reaching to the drain port 543 or a tapered seat surface 544a reaching to the high-pressure port 544, whereby the ports 543, 544 are selectively closed.

A coned disc spring 585 is disposed within the cylinder 584 below the piezoelectric piston 582 for biasing the piezoelectric device 1 upwardly (in the contracting direction) via the piezoelectric piston 582.

In addition, a lead wire 586 for applying voltage is connected to an upper end face of the piezoelectric device 1. This lead wire is electrically connected to the aforesaid two external electrodes 34.

A main orifice 561 is formed between an upper end face of the control chamber 57 and a side of a valve chamber 542, and the control chamber 57 and the valve chamber 542 are caused to communicate normally via this main orifice 561. More specifically, the control chamber 57 selectively provides communication with the drain passage 557 or the high-pressure passage 555, depending upon the seat position of the valve element 541, whereby the oil pressure acting on the nozzle needle 56 is caused to fluctuate.

On the other hand, the control chamber 57 normally communicates with the high-pressure passage 555 via a sub-orifice 562 opened in a side thereof and is designed to continuously introduce high-pressure fuel from the high-pressure passage 555. In this embodiment, the lowering speed of oil in the control chamber 57 which is to be applied to the nozzle needle 56, can be reduced by virtue of the action of the sub-orifice 562, whereas the rising speed thereof can be increased by the same. It is preferable to set the diameter of the sub-orifice 562 equal to or small than that of the main orifice 561.

The operation of the injector 5 constructed as described above will be briefly described.

In a state shown in FIG. 16, the valve element 541 of the three-way valve 54 abuts against an upper seat surface 543a to close the drain port 543 and keeps the high-pressure port 544 open. The control chamber 57 communicates with the high-pressure passage 555 via the main orifice 561 and the sub-orifice 562, whereby the nozzle needle 56 is subjected to the oil pressure force within the control chamber 57 and the biasing force of the spring 554 to close an injection hole 553.

In opening the nozzle needle 56 from this state, a voltage is applied to the piezoelectric device 1 of the piezoelectric actuator 58 via the lead wire 586 so as to cause the piezoelectric device 1 to stretch against the spring force of the coned disc spring 585. Then, the rod 583 of the piezoelectric piston 582 pushes up the valve element 541, which has abutted against the upper seat surface 543a reaching the drain port 543, to open the drain port 543 and then brings the valve element 541 into abutment with the lower seat surface 544a so as to close the high-pressure port 544, whereby the control chamber 57 is caused to communicate with the low-pressure passage 557, and fuel flows out via the main orifice 561 and the valve chamber 542, the oil pressure within the control chamber 57 being thereby lowered.

Next, in closing the nozzle needle 56, the voltage applied to the piezoelectric device 1 of the piezoelectric actuator 58 is lowered. In conjunction with this, the piezoelectric device 1 contracts and the piezoelectric piston 582 is raised by virtue of the spring force of the coned disc spring 585, whereby the upward oil pressure of the high-pressure port 544 is applied to the valve element 541. Then, the valve element 541 moves away from the lower seat surface 544a to open the high-pressure port 544, and the valve element 541 moves further to abut against the upper seat surface 543a to close the drain port 543, whereby the control chamber 57 is allowed to communicate with the high-pressure passage 555 and the oil pressure within the control chamber 57 is increased by the high-pressure fuel flowing therein via the main orifice 561.

Since the control chamber 57 normally communicates with the high-pressure passage 555 via the sub-orifice 562, the high-pressure fuel is allowed to flow into the control chamber 57 both from the main orifice 561 and the sub-orifice 562. Consequently, the oil pressure in the control chamber 57 rises abruptly, and when the total of the oil pressure in the control chamber 57 and the biasing force of the spring 554 exceeds the oil pressure in the fuel reservoir 556, the nozzle needle 56 drops abruptly, whereby the nozzle needle 56 can be closed quickly to stop the injection of fuel.

A remarkable feature of this embodiment is that as described with respect to the first embodiment, the abutment members 61, 62 are joined to the piezoelectric device 1 with the coating member 4 without using any adhesive, whereby the force generated in the piezoelectric device 1, when it stretches or contracts, can be directly transmitted to the valve element 541 in an efficient fashion, thereby making it possible to improve the high-speed response of the injector 5. In addition, since the abutment members 61, 62 are integrally provided on the piezoelectric device 1 with the coating member 4, the piezoelectric device 1 can easily be assembled into the injector 5.

Sixth Embodiment

This embodiment shows modified examples of the cross-sectional configuration of the piezoelectric device 1 according to each of the aforesaid embodiments.

Figure 17A:
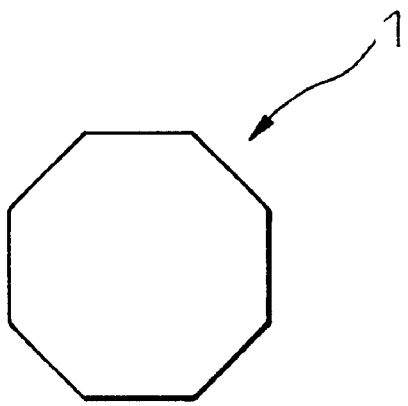
Figure 17B:
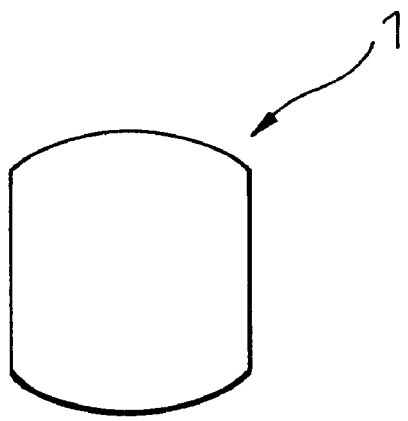
Figure 18:
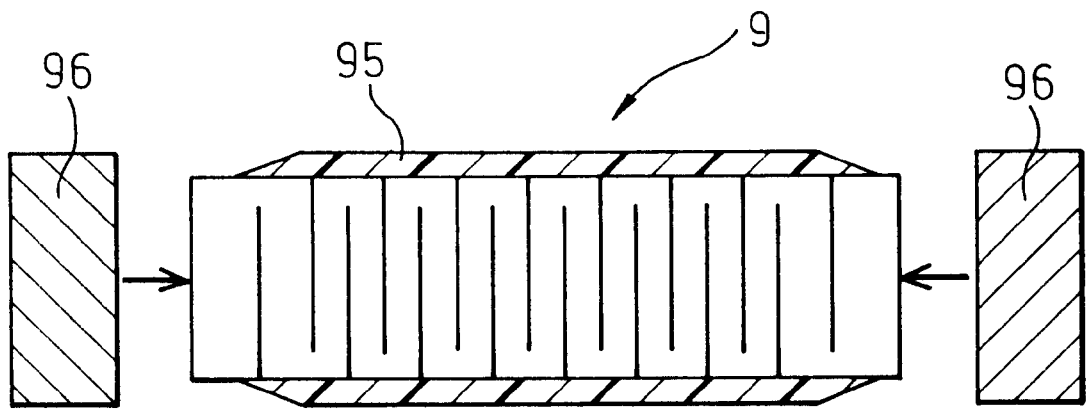
FIG. 18 is an explanatory view showing a conventional piezoelectric device.
Figure 19:
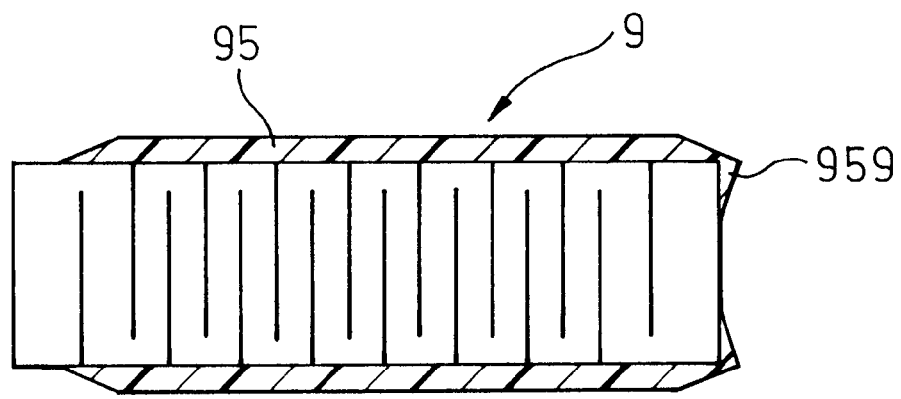
FIG. 19 is an explanatory view showing a problem associated with production of the conventional piezoelectric device.

Namely, as shown in FIGS. 2 and 3A to 3C, the piezoelectric device 1 has a rectangular cross-sectional configuration. In contrast, the cross-section of the piezoelectric device 1 may be a polygonal configuration as shown in FIG. 17A or a barrel-like configuration as shown in FIG. 17B.

In either of these cases, the configuration becomes closer to a circular configuration than the case in which the cross section is rectangular, and waste space can be reduced which would otherwise be present when the piezoelectric device 1 is installed in a circular space, thereby making it possible to provide a more compact injector.

While the invention has been described by reference to the specific embodiments chosen for purposes of illustration, it should be apparent that numerous modifications can be made thereto by those skilled in the art without departing form the basic concept and scope of the invention.

What is claimed is:

1. A stacked-type piezoelectric device comprising:

a plurality of piezoelectric layers and electrode layers which are stacked in alternate fashion, an abutment member which is brought into direct abutment with at least one end face of one of the piezoelectric layers in a stretching direction thereof, the abutment member being made of a different material than the material of the piezoelectric layers;

a coating member having electric insulating properties which covers at least part of the abutment portion between said abutment member and said one of the piezoelectric layers so that the state is maintained in which said abutment member and said one of the piezoelectric layers are in direct abutment with each other without adhesive interposed between the abutment member and said one of the piezoelectric layers.

2. A stacked-type piezoelectric device as set forth in claim 1, wherein said abutment member has electrically insulating properties.

3. A stacked-type piezoelectric device as set forth in claim 1, wherein said coating member covers the full circumference of the abutment portion between said one of the piezoelectric layers and said abutment member.

4. A stacked-type piezoelectric device as set forth in claim 1, wherein the coating member covers the abutment portion between said one of the piezoelectric layers and said abutment member and the entire surface of the outer circumference of said piezoelectric layers.

5. A stacked-type piezoelectric device as set forth in claim 1, further comprising side electrodes disposed on two opposed sides of said piezoelectric layers, and wherein said coating member covers at least said side electrodes entirely.

6. A stacked-type piezoelectric device as set forth in claim 1, wherein said piezoelectric device is adapted to be used for an actuator for use in driving an injector.

\* \* \* \* \*